United States Patent
Sun et al.

(10) Patent No.: US 8,618,535 B2
(45) Date of Patent: Dec. 31, 2013

(54) DONOR FILM FOR THERMAL TRANSFER, METHOD OF MANUFACTURING THE SAME, AND METHOD OF MANUFACTURING ORGANIC LIGHT-EMITTING DEVICE USING THE DONOR FILM

(75) Inventors: Jin-Won Sun, Yongin (KR); Young-Gil Kwon, Yongin (KR); Min-Soo Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 13/443,830

(22) Filed: Apr. 10, 2012

(65) Prior Publication Data
US 2013/0005066 A1  Jan. 3, 2013

(30) Foreign Application Priority Data

Jun. 28, 2011 (KR) .................. 10-2011-0063026

(51) Int. Cl.
*H01L 29/08* (2006.01)

(52) U.S. Cl.
USPC .............................. 257/40; 438/29

(58) Field of Classification Search
USPC ......................................................... 257/40
See application file for complete search history.

(56) References Cited

U.S. PATENT DOCUMENTS

| 7,534,544 B2* | 5/2009 | Principe et al. ............... 430/200 |
| 2008/0233404 A1* | 9/2008 | Wolk et al. ................. 428/411.1 |
| 2009/0104572 A1* | 4/2009 | Gao et al. ...................... 430/348 |

FOREIGN PATENT DOCUMENTS

| KR | 10-2005-0082373 A | 8/2005 |
| KR | 10-2007-0115339 A | 12/2007 |
| KR | 10-2010-0092758 A | 8/2010 |

* cited by examiner

*Primary Examiner* — Ajay K Arora
(74) *Attorney, Agent, or Firm* — Christie, Parker & Hale, LLP (57) ABSTRACT

A donor film that is easily handled in a process without adding a separate member (such as a tray) when an organic thin film is formed on a substrate by using a thermal transfer method is disclosed. In addition, a method of manufacturing the donor film and a method of manufacturing an organic light-emitting device using the donor film are disclosed. The donor film includes: a base film; a light-to-heat conversion (LTHC) layer on the base film; an interlayer on the LTHC layer and that includes a transfer region and a first protrusion corresponding to at least one edge of the LTHC layer; and a transfer layer on the interlayer and including an organic light-emitting material. A rigidity of the first protrusion is higher than a rigidity of the transfer region.

19 Claims, 5 Drawing Sheets

DONOR FILM FOR THERMAL TRANSFER, METHOD OF MANUFACTURING THE SAME, AND METHOD OF MANUFACTURING ORGANIC LIGHT-EMITTING DEVICE USING THE DONOR FILM

CROSS-REFERENCE TO RELATED PATENT APPLICATION

This application claims priority to and the benefit of Korean Patent Application No. 10-2011-0063026, filed on Jun. 28, 2011, in the Korean Intellectual Property Office, the entire content of which is incorporated herein by reference.

BACKGROUND

1. Field

Aspects of embodiments of the present invention relate to a donor film for thermal transfer, a method of manufacturing the donor film, and a method of manufacturing an organic light-emitting device using the donor film.

2. Description of Related Art

Organic light-emitting display apparatuses have been in the spotlight as the next generation display apparatuses because of features such as their low driving voltage, light and thin design, wide viewing angle, excellent contrast ratio, and high response speed. In order for an organic light-emitting display apparatus to achieve high luminous efficiency, functional layers, such as an electron injection layer (EIL), an electron transport layer (ETL), a hole transport layer (HTL), and a hole injection layer (HIL), may be selectively inserted between a light-emitting layer and each electrode.

Thermal transfer is a method of forming an organic thin film such as a light-emitting layer on a substrate of an organic light-emitting display apparatus. Thermal transfer is a method of forming a thin film by preparing a donor film including a transfer layer containing an organic material and applying heat to the donor film by using a laser beam or the like. In this case, since it is not easy to precisely handle the donor film, there is a limitation in forming an organic thin film having desired characteristics.

SUMMARY

Aspects of embodiments of the present invention are directed toward a donor film for thermal transfer, a method of manufacturing the same, and a method of manufacturing an organic light-emitting device using the donor film. In more detail, aspects of embodiments of the present invention are directed toward a donor film for thermal transfer that is easily handled, a method of manufacturing the donor film, and a method of manufacturing an organic light-emitting device using the donor film. Embodiments of the present invention provide for a donor film for thermal transfer that is easily handled without additional elements (such as trays or members) when an organic thin film is formed on a substrate, a method of manufacturing the donor film, and a method of manufacturing an organic light-emitting device using the donor film.

According to an exemplary embodiment of the present invention, a donor film for thermal transfer is provided. The donor film includes: a base film; a light-to-heat conversion (LTHC) layer on the base film, the LTHC layer being configured to convert light to heat; an interlayer on the LTHC layer, the interlayer including a transfer region and a first protrusion, the first protrusion corresponding to at least one edge of the LTHC layer, a rigidity of the first protrusion being higher than a rigidity of the transfer region; and a transfer layer on the interlayer and including an organic material.

The at least one edge of the LTHC layer may include all edges of the LTHC layer, and the first protrusion may form a closed loop.

The interlayer may further include a second protrusion corresponding to an edge of the LTHC layer opposite to the at least one edge of the LTHC layer. The rigidity of the second protrusion may be higher than the rigidity of the transfer region.

A height of the second protrusion may be equal to a height of the first protrusion.

The transfer layer may correspond to the transfer region.

According to another exemplary embodiment of the present invention, a method of manufacturing a donor film for thermal transfer is provided. The method includes: preparing a base film; forming a light-to-heat conversion (LTHC) layer for converting light to heat, on the base film; forming an interlayer on the LTHC layer, the forming of the interlayer comprising forming a transfer region and forming a first protrusion to correspond to at least one edge of the LTHC layer, a rigidity of the first protrusion being higher than a rigidity of the transfer region; and forming a transfer layer comprising an organic material, on the interlayer.

The forming of the first protrusion may include: forming the first protrusion to correspond to all edges of the LTHC layer; and forming the first protrusion in a form of a closed loop.

The forming of the transfer layer may include forming the transfer layer to correspond to the transfer region.

The forming of the first protrusion may further include applying ultraviolet light to a region corresponding to the first protrusion.

The forming of the interlayer may further include forming a second protrusion to correspond to an edge of the LTHC layer opposite to the at least one edge of the LTHC layer. A rigidity of the second protrusion may be higher than the rigidity of the transfer region.

A height of the second protrusion may be equal to a height of the first protrusion.

The forming of the second protrusion further includes applying ultraviolet light to a region corresponding to the second protrusion.

According to yet another exemplary embodiment of the present invention, a method of manufacturing an organic light-emitting device is provided. The method includes: forming a donor film for thermal transfer, the forming of the donor film including: preparing a base film; forming a light-to-heat conversion (LTHC) layer for converting light to heat, on the base film; forming an interlayer on the LTHC layer, the forming of the interlayer including forming a transfer region and forming a first protrusion to correspond to at least one edge of the LTHC layer, a rigidity of the first protrusion being higher than a rigidity of the transfer region; and forming a transfer layer comprising an organic material, on the interlayer; preparing a substrate comprising a first electrode; covering the substrate with the donor film; forming an organic light-emitting layer, the forming of the organic light-emitting layer including transferring the transfer layer of the donor film to the first electrode; and forming a second electrode on the organic light-emitting layer.

The forming of the first protrusion may include: forming the first protrusion to correspond to all edges of the LTHC layer; and forming the first protrusion in a form of a closed loop.

The forming of the transfer layer may include forming the transfer layer to correspond to the transfer region.

The forming of the first protrusion may further include applying ultraviolet light to a region corresponding to the first protrusion.

The forming of the interlayer may further include forming a second protrusion to correspond to an edge of the LTHC layer opposite to the at least one edge of the LTHC layer. A rigidity of the second protrusion may be higher than the rigidity of the transfer region.

A height of the second protrusion may be equal to a height of the first protrusion.

The forming of the second protrusion may further include applying ultraviolet light to a region corresponding to the second protrusion.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

Thermal transfer may be used to form a thin film by preparing a donor film including a transfer layer containing an organic material and applying heat to the donor film by using a laser beam or the like. However, since it is not easy to precisely handle the donor film, there can be a limitation in forming an organic thin film having desired characteristics.

One possible solution of handling such a donor film is by attaching a firm tray (or other member or element) to the donor film. However, as a substrate gets larger, the size and weight of such a tray increase, making this solution less attractive. Accordingly, other possible solutions are discussed as exemplary embodiments of the present invention with reference to the attached drawings.

FIGS. 1 through 6 are cross-sectional views sequentially illustrating a method of manufacturing a donor film 100, according to an embodiment of the present invention.

Figure 1:
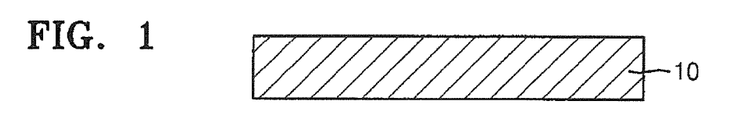
FIGS. 1 through 6 are cross-sectional views sequentially illustrating a method of manufacturing a donor film, according to an embodiment of the present invention.

Referring to FIG. 1, a base film 10 is prepared. The base film 10 may be a flexible film. For example, the base film 10 may be a polyester-based film having a high light transmittance, such as a polyethylene terephthalate (PET) or polyethylene naphthalate (PEN)-based film. However, the present invention is not limited thereto. In other embodiments, the base film 10 may be a glass film, a transparent film, or another polymer film. A thickness of the base film 10 may range from 10 μm to 500 μm.

Figure 2:
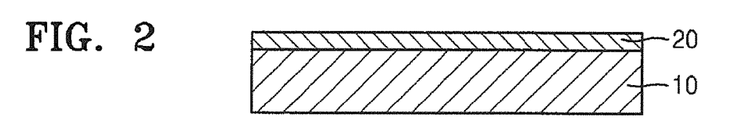

Referring to FIG. 2, a light-to-heat conversion (LTHC) layer 20 that converts incident light to heat is formed on the base film 10. The LTHC layer 20 may include a light-absorbing material that may generate thermal energy by absorbing laser light, and an organic binder material that is curable due to ultraviolet light or heat.

The light-absorbing material may be a metal film formed of aluminum, aluminum oxide, or aluminum sulfide, which may generate thermal energy by absorbing infrared light or visible light, or an organic film formed of a polymer to which carbon black or infrared dye is added. In particular, carbon black absorbs laser light at near infrared ray (NIR) wavelengths of 808 nm to 1064 nm.

In this case, the metal film may be formed to a thickness of 10 nm to 500 nm by using vacuum deposition, electron beam deposition, or sputtering. In addition, the organic film may be formed to a thickness of 0.1 μm to 10 μm by using a general film coating method.

Figure 3:
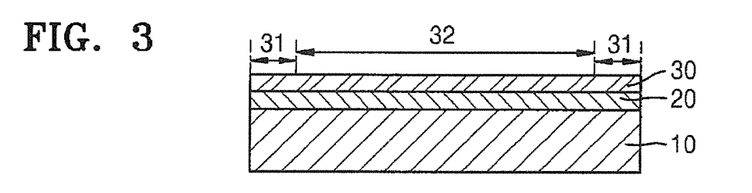

Referring to FIG. 3, an interlayer 30 is formed on the LTHC layer 20. The interlayer 30 may include an acryl or urethane-based organic binder, which is curable through applying ultraviolet light or heat, and may be formed to a thickness of 0.1 μm to 10 μm by using a general film coating method. The interlayer 30 may protect the LTHC layer 20.

The interlayer 30 may be formed on the LTHC layer 20 by using a coating method or the like, and then may be cured by using ultraviolet light. In this case, the interlayer 30 may be cured in 40 seconds according to the methyl ethyl ketone (MEK) rub test. However, in some embodiments, it may be preferable that the interlayer 30 not be completely dried (that is, not completely cured) in order to be able to perform additional coating.

A first region 31 of the interlayer 30 is located on at least one of the edges of the interlayer 30. A region of the interlayer 30 other than the first region 31 is referred to as a second region 32 of the interlayer 30. Although as shown in FIG. 3, the first region 31 is located on both edges of the interlayer 30 about the second region 32, the present invention is not limited thereto. In other embodiments, for example, the first region 31 may be located on only one edge, or on three or more edges of the interlayer 30, or may be located on a portion of one edge, and not one entire edge, of the interlayer 30.

Figure 4:
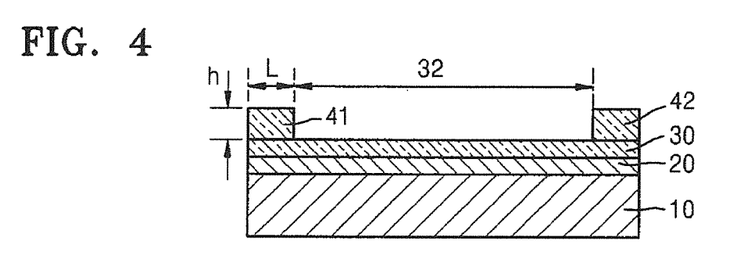

Referring to FIG. 4, a first protrusion 41 and a second protrusion 42 are formed by additionally coating a material for forming the interlayer 30 into respective edges of the first region 31 of the interlayer 30. The number of protrusions is not limited thereto. For example, in other embodiments, one protrusion, or three or more protrusions, may be formed.

The first protrusion 41 and the second protrusion 42 may be formed to have the same height 'h' and width 'L'. For example, the height 'h' of each of the first protrusion 41 and the second protrusion 42 may range from 10 μm to 20 μm, and the width 'L' of each of the first protrusion 41 and the second protrusion 42 may range from 20 mm to 40 mm.

Figure 5:
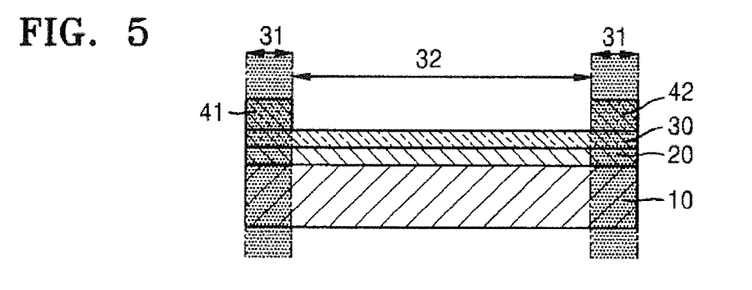

Referring to FIG. 5, ultraviolet light is additionally applied to the first protrusion 41 and the second protrusion 42. That is, the ultraviolet light is applied to the first region 31 in FIG. 5. In this case, the first protrusion 41 and the second protrusion 42 are overcured by applying additional ultraviolet light to only regions corresponding to the first protrusion 41 and the second protrusion 42, so that a rigidity of each of the first protrusion 41 and the second protrusion 42 is higher than a rigidity of the second region 32. Since the first protrusion 41 and the second protrusion 42 act as frames for extending and aligning a donor film in a process of manufacturing an organic thin film, an intensity and a time of ultraviolet light emission are adjusted such that each of the first protrusion 41 and the second protrusion 42 has a sufficiently high rigidity.

In this case, the time of ultraviolet light emission may be longer than 2 minutes according to an MEK rub test. However, the time of ultraviolet light emission may vary according to factors such as the height 'h', the width 'L', or a material of each of the first protrusion 41 and the second protrusion 42.

Figure 6:
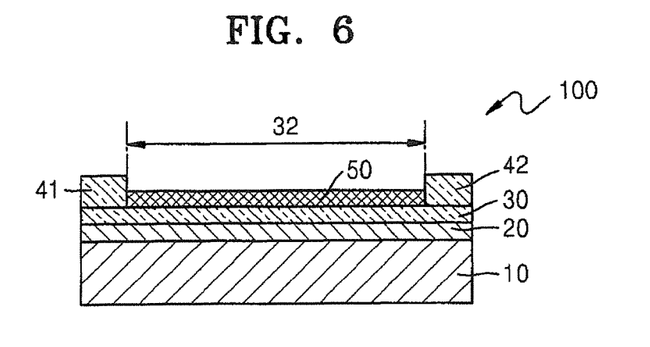

Referring to FIG. 6, a transfer layer 50 including an organic material and used to form an organic layer (such as an organic layer for an organic light-emitting display device) is formed on the interlayer 30. The organic material may be an organic light-emitting material and the organic layer may be an organic light-emitting layer. The transfer layer 50 may be formed to a thickness of 10 nm to 5000 nm by using coating, vacuum deposition, chemical vapor deposition (CVD), or the like. The transfer layer 50 may include a material used to form functional layers such as an electron injection layer (EIL), an electron transport layer (ETL), a hole transport layer (HTL), or a hole injection layer (HIL), in addition to the organic light-emitting layer. In some embodiments, such as that shown in FIG. 6, the transfer layer 50 may be formed in the second region 32 that is a region other than the first region 31 in which the first protrusion 41 and the second protrusion 42 are formed.

Figure 7:
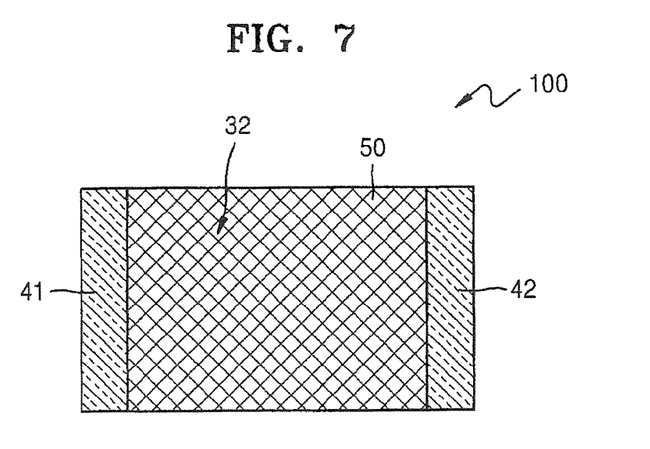
FIG. 7 is a plan view illustrating a donor film manufactured by the method of FIGS. 1 through 6, according to an embodiment of the present invention.

FIG. 7 is a plan view illustrating the donor film 100 manufactured by the method of FIGS. 1 through 6, according to an embodiment of the present invention.

Referring to FIG. 7, the donor film 100 includes the first protrusion 41 and the second protrusion 42. The first protrusion 41 and the second protrusion 42 are formed on both edges of the interlayer 30 that face each other (that is, on opposing sides of the interlayer 30). Accordingly, the donor film 100 has the second region 32 that is flexible and the first region 31 including the first protrusion 41 and the second protrusion 42 that are rigid.

Since each of the first protrusion 41 and the second protrusion 42 has a high rigidity and protrudes, the first protrusion 41 and the second protrusion 42 may be used to extend and align the donor film 100. In particular, the embodiment of FIG. 7 may be useful when the donor film 100 is laminated on a substrate by using a roller.

Figure 8:
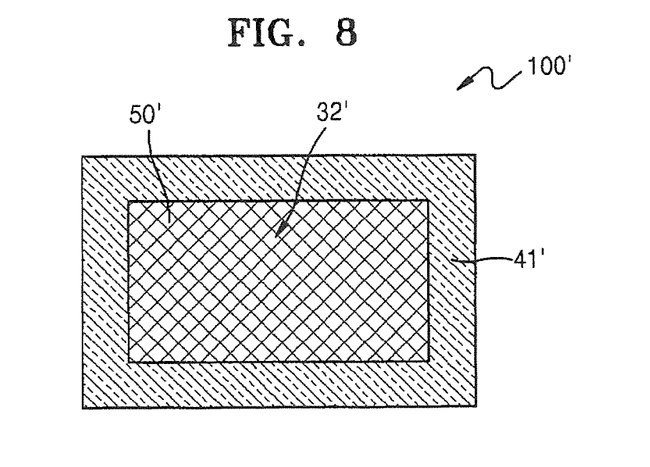
FIG. 8 is a plan view illustrating a donor film according to another embodiment of the present invention.

FIG. 8 is a plan view illustrating a donor film 100' according to another embodiment of the present invention.

Referring to FIG. 8, the donor film 100 of FIG. 7 and the donor film 100' of FIG. 8 are similar except that a first protrusion 41' is formed on all edges of an interlayer 30 (such as the interlayer 30 shown in FIG. 6), with corresponding adjustments to the second region 32' and transfer layer 50'. In this case, the first protrusion 41' forms a closed loop. The embodiment of FIG. 8 may be useful when the donor film 100' is laminated as a sheet on a substrate, not using a roller.

FIGS. 9 through 17 are cross-sectional views sequentially illustrating a method of manufacturing an organic light-emitting device using the donor film 100 of FIG. 7, according to an embodiment of the present invention.

Figure 9:
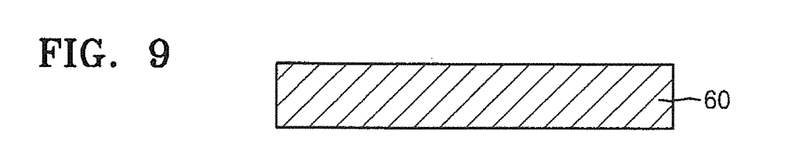
FIGS. 9 through 17 are cross-sectional views sequentially illustrating a method of manufacturing an organic light-emitting device using the donor film of FIG. 7, according to an embodiment of the present invention.

Referring to FIG. 9, a base member 60 that acts as a mechanical support is prepared. The base member 60 is located in a vacuum chamber.

Figure 10:
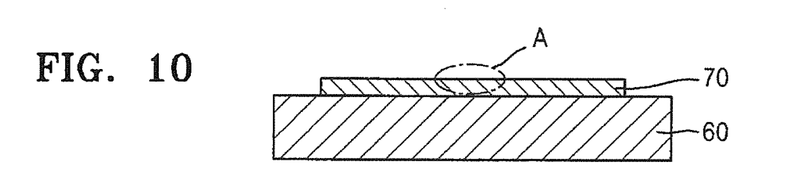

Referring to FIG. 10, a substrate 70 is located (for example, placed or formed) on the base member 60. The substrate 70 may be formed of a transparent glass material containing $SiO_2$ as a main component. The substrate 70 is not limited thereto. In other embodiments, the substrate may be formed of any of various materials such as a metal material or a plastic material. Although not shown, a buffer layer formed of SiOx and/or SiNx may be further placed or formed on the substrate 70 to planarize the substrate 70 and prevent or reduce penetration of impurity elements.

Figure 11:
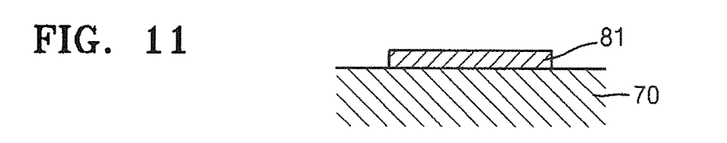

FIG. 11 is an enlarged cross-sectional view illustrating a region A of FIG. 10. Referring to FIG. 11, a first electrode 81 is formed on the substrate 70 by using vacuum deposition, electron beam deposition, or sputtering.

The first electrode 81 is located on the substrate 70. The first electrode 81 may be a reflective electrode, and may include a reflective film formed of silver (Ag), magnesium (Mg), aluminum (Al), platinum (Pt), palladium (Pd), gold (Au), nickel (Ni), neodymium (Nd), iridium (Ir), chrome (Cr), or a compound thereof, and a transparent electrode layer formed on the reflective film. The transparent electrode layer may include at least one selected from the group consisting of indium tin oxide (ITO), indium zinc oxide (IZO), zinc oxide (ZnO), indium (III) oxide ($In_2O_3$), indium gallium oxide (IGO), and aluminum zinc oxide (AZO).

A plurality of the reflective films and/or the transparent electrode layers may be stacked. That is, a reflective film may be located between two transparent electrode layers. In addition, the first electrode 81 may be a transparent or semi-transparent electrode including only a transparent electrode layer, and not including the reflective film.

The substrate 70 may further include a pixel circuit unit including a thin film transistor (TFT). The pixel circuit unit, and in particular, the TFT, may be electrically connected to the first electrode 81.

Figure 12:
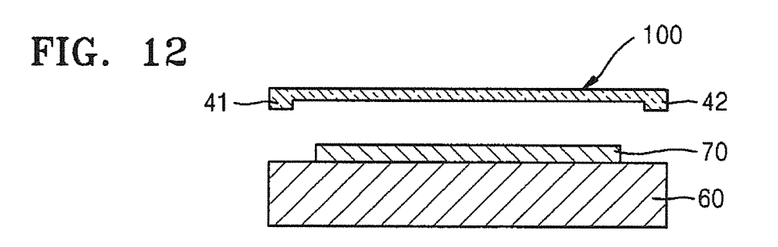

Referring to FIG. 12, the donor film 100 of FIG. 7 is prepared to face the substrate 70.

In order to align and stably bond the donor film 100 and the substrate 70, the donor film 100 is extended by using the first protrusion 41 and the second protrusion 42. The donor film 100 having been extended is aligned with a pixel region on the substrate 70. In this case, the first protrusion 41 and the second protrusion 42 of the donor film 100 are located outside the substrate 70.

Figure 13:
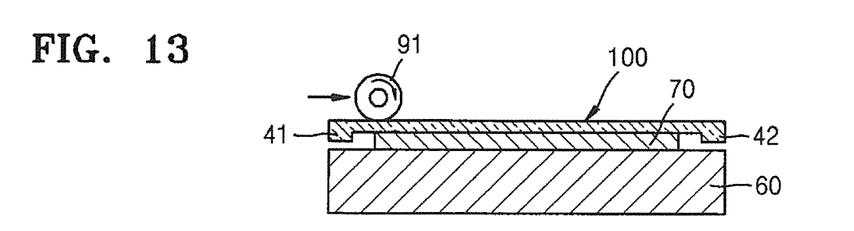

FIG. 13 is a cross-sectional view illustrating a process of laminating the substrate 70 and the donor film 100. Referring to FIG. 13, the substrate 70 and the donor film 100 may be laminated by using a rolling method using a roller 91. However, the present invention is not limited thereto. In other embodiments, the substrate 70 and the donor film 100 may be laminated by other methods, such as using a gas pressure method. The substrate 70 and the donor film 100 may be laminated in a laser thermal transfer device.

Figure 14:
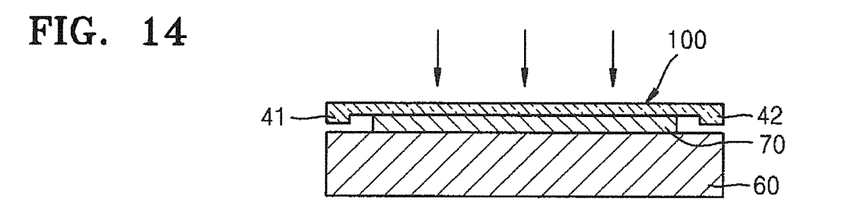

Referring to FIG. 14, after the substrate 70 and the donor film 100 are laminated, an organic layer, such as organic light-emitting layer 82 (see FIG. 16), is transferred to the first electrode 81 (see FIG. 16) by applying laser light to a region (for example, a predetermined region) of the donor film 100. It should be noted that the organic layer, such as the organic light-emitting layer 82, corresponds to the transfer layer 50 of the donor film 100, reoriented to face the substrate 70 (and the first electrode 81).

The organic light-emitting layer 82 may be formed of a low molecular weight organic material or a high molecular weight organic material. If the organic light-emitting layer 82 is formed of a low molecular weight organic material, a hole transport layer (HTL), a hole injection layer (HIL), an emission layer (EML), an electron transport layer (ETL), and an electron injection layer (EIL), or various combinations of these layers, may be stacked. In addition, various other layers may be stacked if necessary. In this case, examples of the low molecular weight organic material may include copper phthalocyanine (CuPc), N'-Di(naphthalene-1-yl)-N,N'-diphenyl-benzidine (NPB), and tris-8-hydroxyquinoline aluminum (Alq3).

On the other hand, if the organic light-emitting layer 82 is formed of a high molecular weight organic material, an HTL in addition to an EML may be included. The HTL may be formed of poly-(2,4)-ethylene-dihydroxy thiophene (PE- DOT), polyaniline (PANI), or the like. In this case, examples of the high molecular weight organic material include a polyphenylenevinylene (PPV)-based high molecular weight organic material and a polyfluorene-based high molecular weight organic material.

The laser light (for transferring the organic light-emitting layer 82) may be a Nd:YAG laser operating at a wavelength of 1064 nm, but the present invention is not limited thereto. In other embodiments, different lasers or wavelengths may be used.

Such a laser thermal transfer process may be performed in the laser thermal transfer device.

Figure 15:
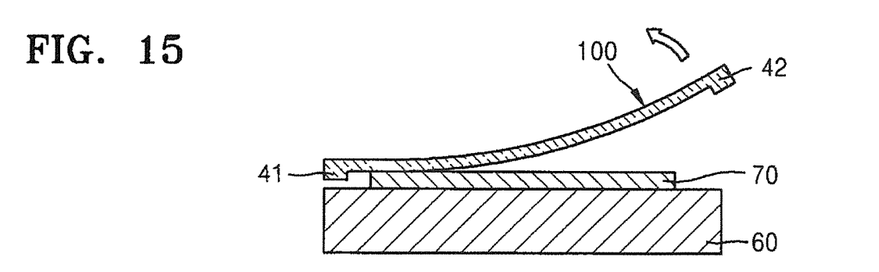
Figure 16:
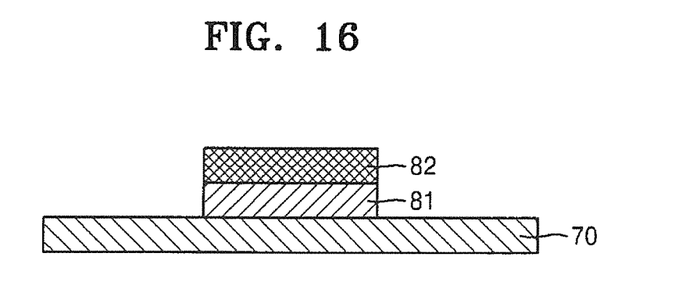

FIG. 15 is a cross-sectional view illustrating a process of removing the donor film 100 from the substrate 70. FIG. 16 is a cross-sectional view illustrating the organic light-emitting layer 82 formed on the first electrode 81.

After the laser thermal transfer process is performed and the donor film 100 is removed, the organic layer, such as the organic light-emitting layer 82, is formed on the first electrode 81 (by being transferred from the donor film 100). Further, in order to improve characteristics of the organic light-emitting device, one or more functional layers selected from the group consisting of an HIL, an HTL, an ETL, and an EIL may be further formed. That is, in some embodiments, the donor film 100 may only transfer a portion (e.g., one or more constituent layers) of the organic light-emitting layer 82. Here, the functional layers may be formed as common layers by using spin coating or deposition, or may be formed by using a laser thermal transfer method at the same time as the organic layer (e.g., the organic light-emitting layer 82) is formed by using the donor film 100.

Although not shown, the base member 60 may be separated from the substrate 70 when the organic light-emitting layer 82 is formed.

Figure 17:
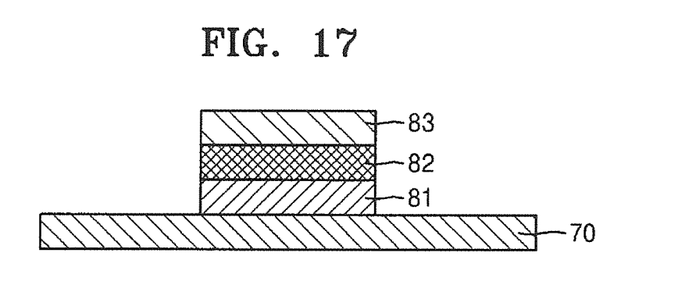

Referring to FIG. 17, a second electrode 83 is formed on the organic light-emitting layer 82.

If the first electrode 81 is a reflective electrode, the second electrode 83 may be a transparent or semi-transparent electrode. In this case, the second electrode 83 may be formed as a semi-transparent and semi-reflective electrode by depositing a metal thin film including a metal having a low work function, such as lithium (Li), calcium (Ca), lithium fluoride/calcium (LiF/Ca), lithium fluoride/aluminum (LiF/Al), aluminum (Al), silver (Ag), or magnesium (Mg), or a compound thereof. Alternatively, an auxiliary electrode layer or a bus electrode formed of a material for forming a transparent electrode, such as ITO, IZO, ZnO, or $In_2O_3$, may be further formed on the metal thin film. A bus line may be further formed by thickly forming a metal having high conductivity in a region other than a light-emitting region.

If the first electrode 81 is a transparent or semi-transparent electrode, the second electrode 83 may be a reflective electrode. In this case, the second electrode 83 may be formed, for example, by depositing Li, Ca, LiF/Ca, LiF/Al, Al, Ag, Mg, or a compound thereof on the entire organic light-emitting layer 82.

Although not shown, after the second electrode 83 is formed, the organic light-emitting device is completed by encapsulating the second electrode 83 with an encapsulating member such as a metal cap or a glass substrate.

As described above, according to a donor film for thermal transfer, a method of manufacturing the same, and a method of manufacturing an organic light-emitting device using the donor film of the above embodiments of the present invention, the donor film may be easily handled in a process without additional elements, and an organic thin film may in turn be effectively formed on a substrate by using the donor film.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A donor film for thermal transfer, the donor film comprising:
 a base film;
 a light-to-heat conversion (LTHC) layer on the base film, the LTHC layer being configured to convert light to heat;
 an interlayer on the LTHC layer, the interlayer comprising a transfer region and a first protrusion, the first protrusion corresponding to at least one edge of the LTHC layer, a rigidity of the first protrusion being higher than a rigidity of the transfer region; and
 a transfer layer on the interlayer and comprising an organic material.

2. The donor film of claim 1, wherein
 the at least one edge of the LTHC layer comprises all edges of the LTHC layer, and
 the first protrusion forms a closed loop.

3. The donor film of claim 1, wherein
 the interlayer further comprises a second protrusion corresponding to an edge of the LTHC layer opposite to the at least one edge of the LTHC layer, and
 a rigidity of the second protrusion is higher than the rigidity of the transfer region.

4. The donor film of claim 3, wherein a height of the second protrusion is equal to a height of the first protrusion.

5. The donor film of claim 1, wherein the transfer layer corresponds to the transfer region.

6. A method of manufacturing a donor film for thermal transfer, the method comprising:
 preparing a base film;
 forming a light-to-heat conversion (LTHC) layer for converting light to heat, on the base film;
 forming an interlayer on the LTHC layer, the forming of the interlayer comprising forming a transfer region and forming a first protrusion to correspond to at least one edge of the LTHC layer, a rigidity of the first protrusion being higher than a rigidity of the transfer region; and
 forming a transfer layer comprising an organic material, on the interlayer.

7. The method of claim 6, wherein the forming of the first protrusion comprises:
 forming the first protrusion to correspond to all edges of the LTHC layer; and
 forming the first protrusion in a form of a closed loop.

8. The method of claim 6, wherein the forming of the transfer layer comprises forming the transfer layer to correspond to the transfer region.

9. The method of claim 6, wherein the forming of the first protrusion further comprises applying ultraviolet light to a region corresponding to the first protrusion.

10. The method of claim 6, wherein
 the forming of the interlayer further comprises forming a second protrusion to correspond to an edge of the LTHC layer opposite to the at least one edge of the LTHC layer, and
 a rigidity of the second protrusion is higher than the rigidity of the transfer region.

11. The method of claim 10, wherein a height of the second protrusion is equal to a height of the first protrusion.

12. The method of claim 10, wherein the forming of the second protrusion further comprises applying ultraviolet light to a region corresponding to the second protrusion.

13. A method of manufacturing an organic light-emitting device, the method comprising:
　forming a donor film for thermal transfer, the forming of the donor film comprising:
　　preparing a base film;
　　forming a light-to-heat conversion (LTHC) layer for converting light to heat, on the base film;
　　forming an interlayer on the LTHC layer, the forming of the interlayer comprising forming a transfer region and forming a first protrusion to correspond to at least one edge of the LTHC layer, a rigidity of the first protrusion being higher than a rigidity of the transfer region; and
　　forming a transfer layer comprising an organic material, on the interlayer;
　preparing a substrate comprising a first electrode;
　covering the substrate with the donor film;
　forming an organic light-emitting layer, the forming of the organic light-emitting layer comprising transferring the transfer layer of the donor film to the first electrode; and
　forming a second electrode on the organic light-emitting layer.

14. The method of claim 13, wherein the forming of the first protrusion comprises:
　forming the first protrusion to correspond to all edges of the LTHC layer; and
　forming the first protrusion in a form of a closed loop.

15. The method of claim 13, wherein the forming of the transfer layer comprises forming the transfer layer to correspond to the transfer region.

16. The method of claim 13, wherein the forming of the first protrusion further comprises applying ultraviolet light to a region corresponding to the first protrusion.

17. The method of claim 13, wherein
　the forming of the interlayer further comprises forming a second protrusion to correspond to an edge of the LTHC layer opposite to the at least one edge of the LTHC layer, and
　a rigidity of the second protrusion is higher than the rigidity of the transfer region.

18. The method of claim 17, wherein a height of the second protrusion is equal to a height of the first protrusion.

19. The method of claim 17, wherein the forming of the second protrusion further comprises applying ultraviolet light to a region corresponding to the second protrusion.

* * * * *